USOO6826048B1

(12) United States Patent
Dean et al.

(10) Patent No.: US 6,826,048 B1
(45) Date of Patent: Nov. 30, 2004

(54) METHOD AND APPARATUS FOR SECURING A FAN WITHIN A DEVICE

(75) Inventors: Ronald P. Dean, Fort Collins, CO (US); Owen T. Richard, Fort Collins, CO (US); William J. Armiger, Columbia, SC (US); James R. Bullington, Athens, AL (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/666,360

(22) Filed: Sep. 18, 2003

(51) Int. Cl.$^7$ ................................................ H05K 7/20
(52) U.S. Cl. ...................... 361/695; 361/694; 174/16.1; 165/80.3; 165/122; 454/184; 415/213.1
(58) Field of Search ................................ 361/687, 690, 361/694, 695, 697; 174/16.1, 16.3; 165/80.3, 122, 104.33; 454/184; 415/213.1

(56) References Cited

U.S. PATENT DOCUMENTS

| | | | |
|---|---|---|---|
| 4,356,531 A | | 10/1982 | Marino et al. |
| 4,728,160 A | | 3/1988 | Mondor et al. |
| 4,739,445 A | | 4/1988 | Tragen |
| 4,750,860 A | | 6/1988 | Kelley |
| D297,455 S | | 8/1988 | Goldfarb et al. |
| 5,208,730 A | | 5/1993 | Tracy |
| 5,613,906 A | | 3/1997 | Kikinis |
| 5,680,295 A | | 10/1997 | Le et al. |
| 5,717,570 A | | 2/1998 | Kikinis |
| 5,788,566 A | * | 8/1998 | McAnally et al. .......... 454/184 |
| 5,831,525 A | | 11/1998 | Harvey |
| 5,936,836 A | | 8/1999 | Scholder |
| 5,949,646 A | | 9/1999 | Lee et al. |
| 6,040,981 A | * | 3/2000 | Schmitt et al. ............. 361/695 |
| 6,058,009 A | | 5/2000 | Hood, III et al. |
| 6,069,792 A | | 5/2000 | Nelik |
| 6,094,345 A | | 7/2000 | Diemunsch |
| 6,101,459 A | | 8/2000 | Tavallaei et al. |
| 6,118,655 A | | 9/2000 | Mecredy, III et al. |
| 6,129,528 A | | 10/2000 | Bradbury et al. |
| 6,176,299 B1 | | 1/2001 | Hanzlik et al. |
| 6,215,659 B1 | | 4/2001 | Chen |
| 6,288,898 B1 | | 9/2001 | Johnson et al. |
| 6,304,443 B1 | | 10/2001 | Chou |
| 6,311,767 B1 | | 11/2001 | Inoue et al. |
| 6,313,988 B1 | | 11/2001 | Pham |
| 6,351,380 B1 | | 2/2002 | Curlee et al. |
| 6,373,698 B1 | | 4/2002 | Christensen |
| 6,377,455 B1 | | 4/2002 | Nelik |
| 6,386,843 B1 | * | 5/2002 | Umeda et al. ......... 417/423.14 |
| 6,435,889 B1 | * | 8/2002 | Vinson et al. .............. 439/247 |
| 6,459,575 B1 | | 10/2002 | Esterberg |
| 6,464,578 B1 | * | 10/2002 | Chin et al. .................. 454/184 |
| 6,547,516 B2 | * | 4/2003 | Liu ........................... 415/108 |
| 6,547,540 B1 | * | 4/2003 | Horng et al. .......... 417/423.14 |
| 6,567,267 B1 | | 5/2003 | Wang |
| 2003/0011985 A1 | | 1/2003 | Jensen et al. |

* cited by examiner

*Primary Examiner*—Boris Chervinsky

(57) ABSTRACT

A system and method for securing a fan within an electrical device. The system comprising a housing adapted to capture the fan therein. The housing may comprise a first catch adapted to capture a fan having an having a first thickness within the housing. The system may comprise a second catch adapted to capture a fan having a second thickness within the housing. The method comprises disposing a fan within a fan housing operable to capture fans of different thickness therein.

30 Claims, 4 Drawing Sheets

METHOD AND APPARATUS FOR SECURING A FAN WITHIN A DEVICE

BACKGROUND

Electrical devices typically generate heat during operation due to the flow of electricity through electrical components housed within the device. Electrical components may be damaged if this heat is not removed. Consequently, various cooling methods have been developed to remove heat produced within an electrical device. Some of these methods use natural convection to produce a flow of air through the device to remove heat. For example, the electrical device may have ventilation holes to let hot air flow out of the device and cool air flow into the device.

Other electrical devices use one or more electric fans to produce a flow of air through the device. For example, a typical home computer has a cooling fan to cool the processor. In other systems, several fans may be used to remove heat from within the device. In mission critical systems, such as servers, redundant fans may be provided that are operable to respond when another fan fails, either by initiating operation or by increasing speed.

Several different sizes and types of fans have been used in electrical devices to remove heat. Unfortunately, each of these sizes and types of fans may require their own components for installation. In addition, methods of installing the fans within an electrical device may require numerous parts, such as fasteners. These factors tend to increase the time and expense in designing, manufacturing, and/or operating electrical devices that use fans.

BRIEF DESCRIPTION OF THE DRAWINGS

Advantages of various embodiments of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally speaking, in accordance with embodiments of the present invention, techniques for improving the design, manufacture, and/or operation of an electrical device are described. In accordance with one embodiment, a fan housing is provided for securing a fan within an electrical device. The fan housing is operable to capture fans of different heights, widths, and depths within the fan housing. In addition, the fan housing and the chassis of an electrical device are adapted to enable the chassis to capture the fan housing. Thus, fans of different heights, widths, and depths may be installed within an electrical device using the same housing and without using any fasteners, such as a screw or rivet. No tools are needed to install the fans within the electrical device because no fasteners requiring tools to install the fasteners are used.

Figure 1:
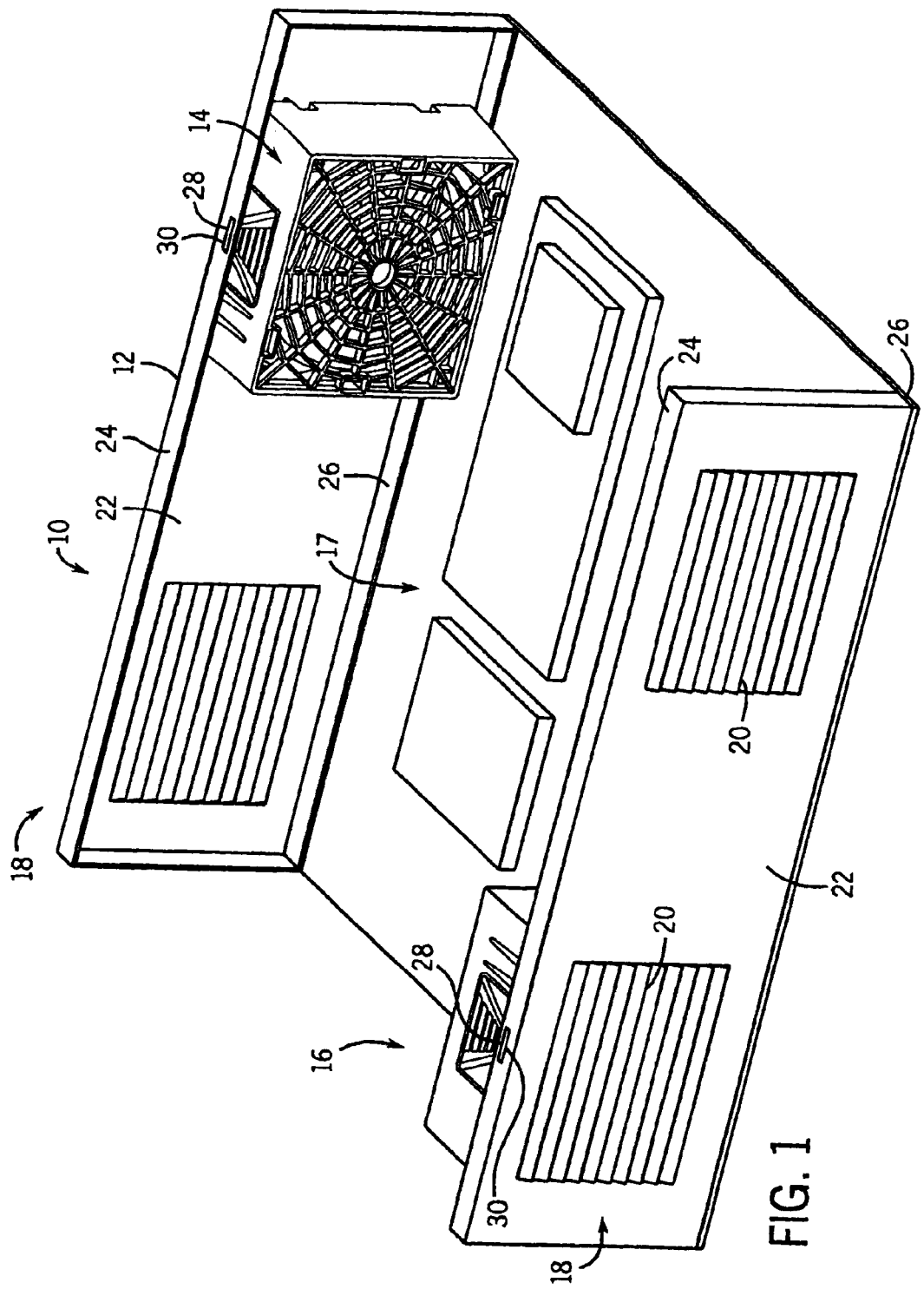
FIG. 1 is a perspective view of an electronic device housing in accordance with an exemplary embodiment of the present invention.
Figure 2:
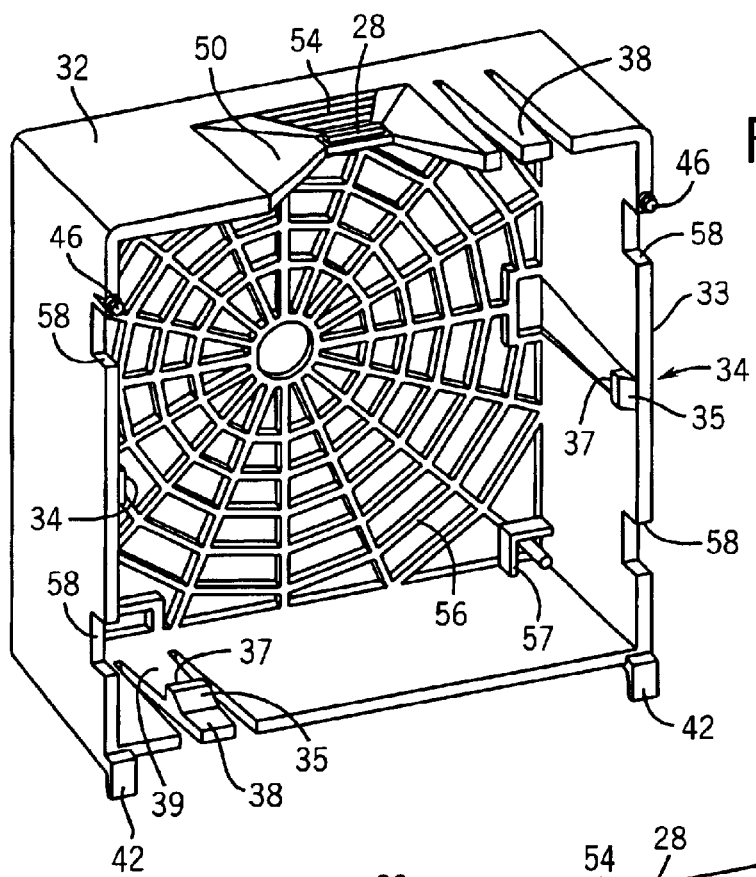
FIG. 2 is a perspective view of a fan housing, in accordance with an exemplary embodiment of the present invention.

Turning now to the drawings, and referring initially to FIG. 1, a portion of an electrical device 10 is illustrated. The electrical device 10 may be a desktop computer, a server, or any of a myriad of other electrical devices. The electrical device 10 has a chassis 12 within which various electrical components are housed. In the illustrated embodiment, the chassis 12 has a first fan assembly 14 and a second fan assembly 16 to provide a flow of cooling air through the chassis 12 to cool electrical components 17 disposed within the electrical device 10. However, a greater or lesser number of fan assemblies may be used. As discussed in detail below, the first fan assembly 14 and second fan assembly 16 each have a fan and a fan housing to secure the fan to the chassis 12.

In the illustrated embodiment, the chassis 12 has two sidewalls 18. Ventilation holes 20 are provided in the sidewalls 18 to enable air to flow into and out of the chassis 12. The sidewalls 18 are comprised of wall members 22 that are secured to the chassis 12. The wall members 22 are operable to capture the first fan assembly 14 and the second fan assembly 16. In the illustrated embodiment, the wall members 22 have a top shelf 24 and a bottom shelf 26. However, other chassis configurations may be used to capture the fan assemblies. In the illustrated embodiment, the first fan assembly 14 and the second assembly 16 each have a catch 28 that is captured within an opening 30 in the top shelf 24 of the wall member 22 to secure the fan assemblies to the wall member 22.

Referring generally to FIGS. 1–4, both the first fan assembly 14 and the second fan assembly 16 comprise a fan housing 32 that is operable to secure a fan disposed therein to the chassis 12. In the illustrated embodiment, each fan housing 32 is adapted to house one or more fans having a defined height and width. For example, the fan housing 32 may be adapted to capture a fan having a height of 120 mm and a width of 120 mm, or other dimensions as desired. In addition, the illustrated fan housing 32 is adapted to capture one or more fans having one of a plurality of defined depths or thicknesses. For example, the same fan housing 32 may be operable to capture either a fan having a depth of 38 mm or a fan having a depth of 25 mm. Similarly, the fan housing 32 may be utilized to capture a plurality of fans having a combined depth of 38 mm, 25 mm, etc. Furthermore, the fans may be of the same type or of different types. For example, the fan housing 32 may be used to capture a fan having a single fan blade or a fan having multiple fan blades. In the illustrated embodiment, the fan housing 32 is made of a flexible polymeric material, such as plastic. However, the fan housing 32 may be made of other materials, such as metal.

Figure 3:
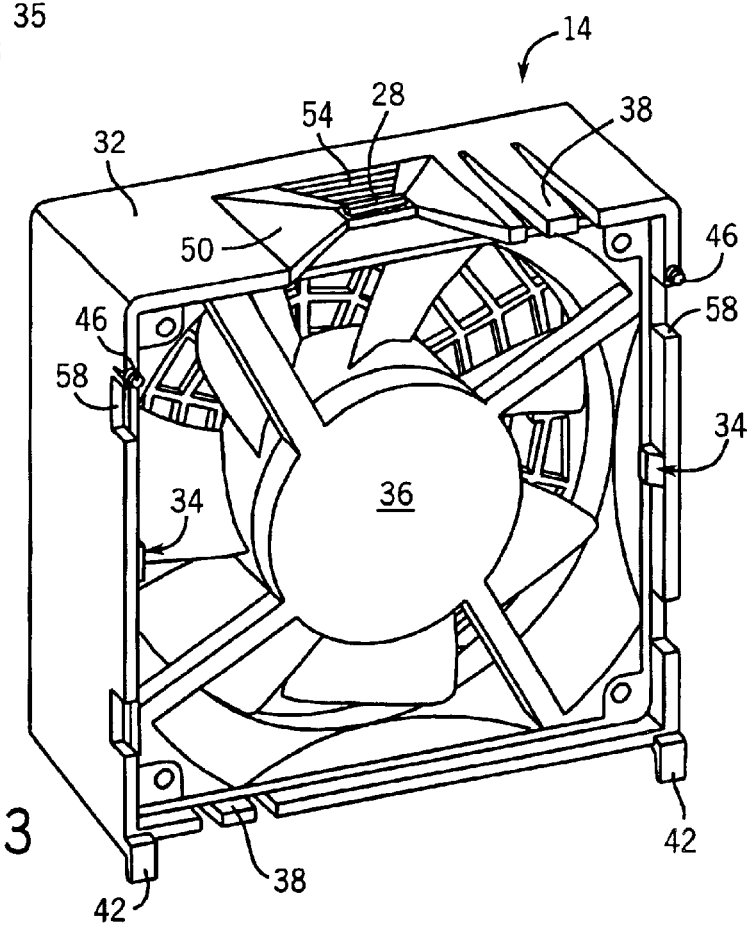
FIG. 3 is a perspective view of a fan assembly having a fan of a first thickness, in accordance with an exemplary embodiment of the present invention.

The illustrated fan housing 32 is formed with a pair of first catches 34 that are oppositely disposed on sides 35 of the fan housing 32 to enable the fan housing 32 to capture a fan, or fans, having a first thickness within the fan housing 32. As best illustrated in FIG. 3, in addition to the fan housing 32, the first fan assembly 14 comprises a first fan 36 having a thickness corresponding to the first thickness.

During assembly of the first fan assembly 14, the first fan 36 engages a sloped portion 35 of each first catch 34 as the first fan 36 is disposed within the fan housing 32. The sides 35 of the fan housing are flexed outward by the first fan 36 as the first fan 36 engages the sloped portion 35 of the first catches 34. When the first fan 36 clears the first catches 34, the first catches 34 are urged inward to a location behind the first fan 36, in this view, by the fan housing 32. The first fan 36 is captured between a flanged portion 37 of each first catch 34 and a portion of the fan housing 32 forward of the first fan 36 against which the first fan 36 abuts. The first thickness is measured from the surface of the flanged portion 37 of the first catch 34 to the portion of the fan housing 32 against which the first fan 36 abuts. Although the illustrated embodiment of the fan housing 32 is shown with a pair of first catches 34, the fan housing 32 may be formed with a greater or lesser number of first catches 34.

Figure 4:
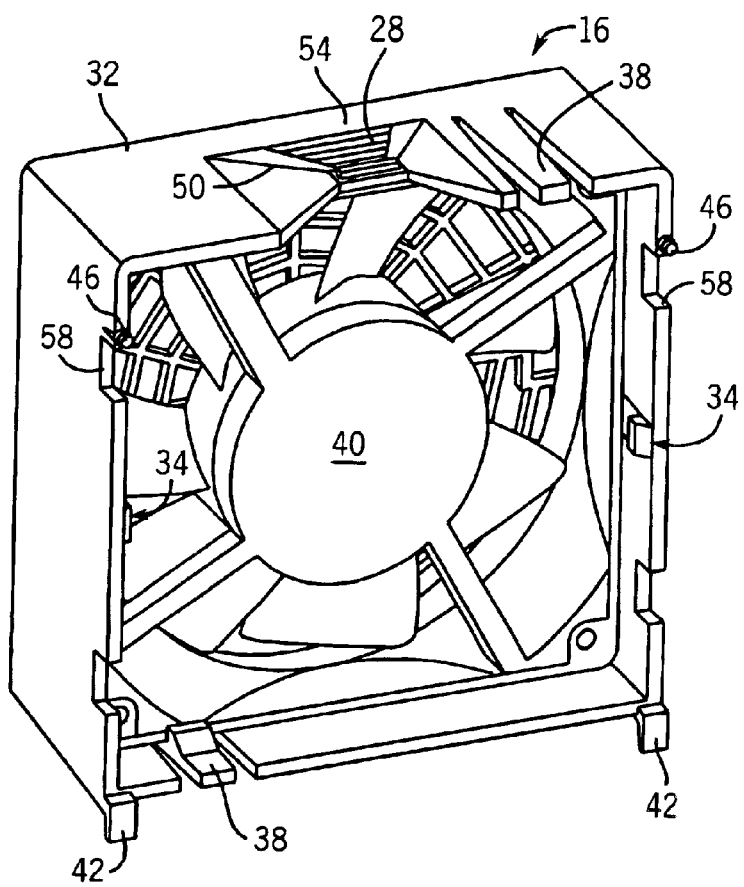
FIG. 4 is a perspective view of fan assembly having a fan of a second thickness, in accordance with an exemplary embodiment of the present invention.

In addition, the fan housing 32 also has a pair of second catches 38 to enable the fan housing 32 to capture a fan, or fans, having a second thickness, the second thickness being less than the first thickness. The second thickness is measured from the surface of the flanged portion 37 of the second catches 38 to a portion of the fan housing 32 against which the second fan 40 abuts. As with the first catches 34, the fan housing 32 may be formed with a greater or lesser number of second catches 38. In the illustrated embodiment, two of the sides 35 of the fan housing 32 are adapted to form flexible members 39 upon which the second catches 38 are disposed. As best illustrated in FIG. 4, the second fan assembly 16 comprises a second fan 40 having a thickness corresponding to the second thickness.

During assembly of the second fan assembly 16, the second fan 40 engages sloped portions 35 of the second catches 38 causing the flexible members 39 to flex outward. The flexible members 39 urge the flanged portions 37 of the second catches 38 inward to a location behind the second fans 40 in this view, capturing the second fan 40 within the fan housing 32. In addition, the flexible members 39 enable the second catches 38 to be flexed outward easily when the first fans 36 are disposed within the fan housing 32. By adapting the fan housing 32 to capture the first fan 36 and the second fan 40, rather than using a fastener to secure the fans to the fan housing 32, no tools or removable fasteners are needed to secure either the first fan 36 or the second fan 40 to the fan housing 32.

Figure 5:
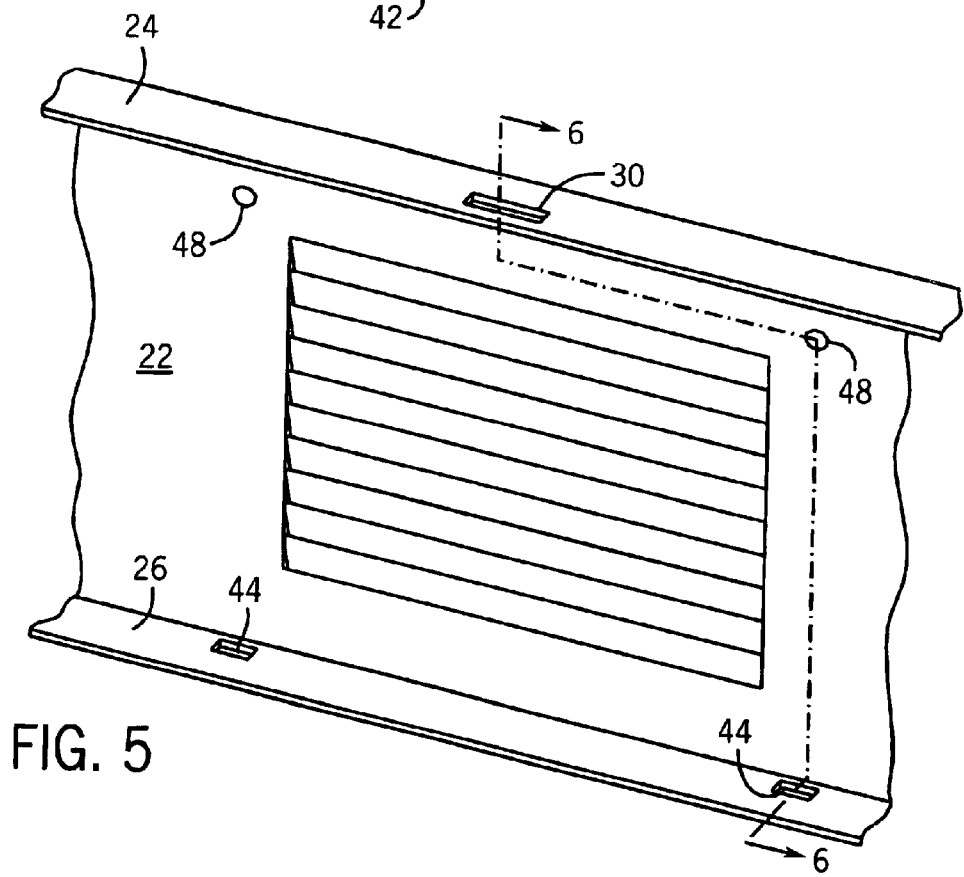
FIG. 5 is a perspective view of a portion of a chassis adapted to secure the fan assemblies to the chassis, in accordance with an exemplary embodiment of the present invention.
Figure 6:
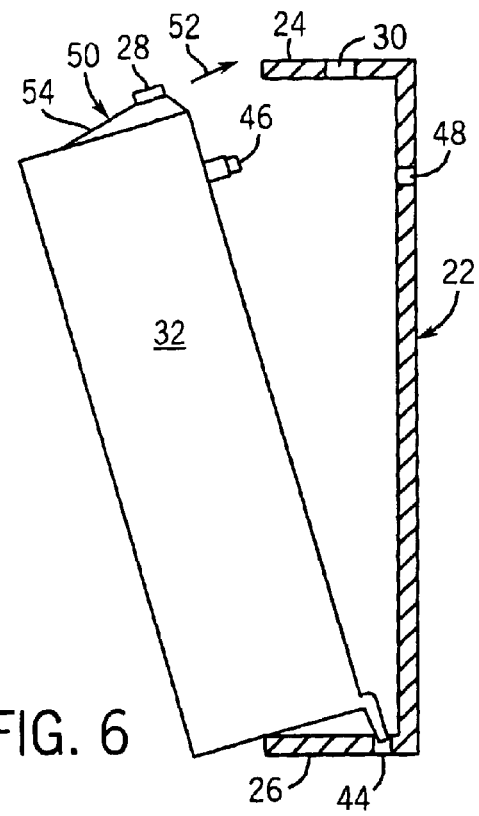
FIG. 6 is a cross-sectional view taken generally along line 6—6 of FIG. 5 of a fan assembly in the process of being secured within the chassis, in accordance with an exemplary embodiment of the present invention.
Figure 7:
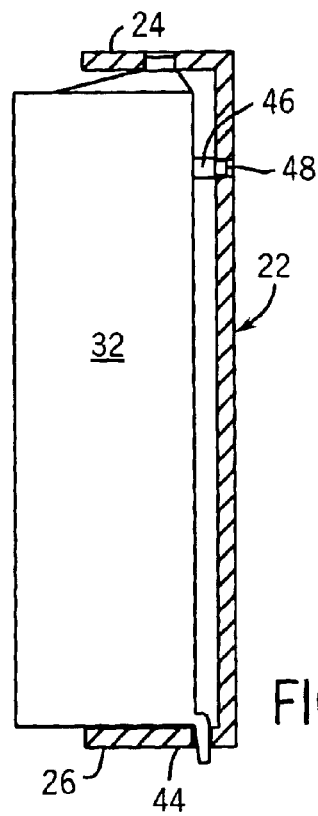
FIG. 7 is a cross-sectional view taken generally along line 6—6 of FIG. 5 of a fan assembly secured within the chassis, in accordance with an exemplary embodiment of the present invention.

Referring generally to FIGS. 5–7, the fan housing 32 is adapted to be captured by the wall member 22 or by another fixed member within the electrical device 10. In the illustrated embodiment, the fan housing 32 has a pair of projections or hooks 42 adapted to engage recesses or holes 44 in the bottom shelf 26 of wall member 22. In addition, the fan housing 32 also comprises a pair of locator projections or pins 46 adapted to engage corresponding locator recesses or holes 48 in wall member 22. The hooks 42 and holes 44 cooperate to prevent lateral movement of the fan housing 32 relative to the wall member 22. In addition, the locator pins 46 and locator holes 48 cooperate prevent lateral movement of the fan housing 32 relative to the wall member 22. However, the locator pins 46 and locator holes 48 also cooperate to prevent vertical movement of the fan housing 32 relative to the wall member 22. The catch 28 maintains the fan housing 32 pivoted against the wall member 22 so that the locator pins 46 are maintained within the locator holes 44.

In the illustrated embodiment, the catch 28 is disposed on a raised portion 50 of the fan housing 32. The raised portion 50 of the fan housing 32 is flexible so that the catch 26 is depressed by the top shelf 24 of the wall member 22 as the fan housing 32 is disposed under the top shelf 24 of the wall member 22. However, the raised portion 50 is biased so that the catch 28 is urged outward into the opening 30 in the top shelf 22 when the catch 28 is aligned with the opening 30. The locator pins 46 and locator holes 48 cooperate to assist in aligning the catch 28 with the opening 30.

To install the fan housing 32 to the wall member 22, the hooks 42 are disposed through the openings 44 and the bottom shelf 26 of wall member 22. The hooks 44 are adapted to enable the fan housing 32 to be pivoted towards the wall member 22, as represented by arrow 52. As the fan housing 32 is brought towards the wall member 22, the catch 28 engages the top shelf 24 of the wall member 22, compressing the raised portion 50. When the catch 28 aligns with the hole 30 in top shelf 24, the raised portion 50 urges the catch 28 into the hole 28. In one embodiment, the fan housing 32 and wall member 22 snappingly engage and lock together to form a sturdy, yet removable connection. The components can be configured so that an audible "snapping" sound is generated to announce the securement of the fan housing 32 to the well member 22. In addition, the locator pins 46 are inserted into the locator holes 48 as the fan housing 32 is pivoted toward the wall member 22.

The fan housing 32 may also be removed from the wall member 22 without the use of a tool. The raised portion 50 of the fan housing 32 has an area 54 that serves as a finger press to enable a user to depress the raised portion 50 to withdraw the catch 28 from the opening 30. Withdrawing the catch 28 from the hole 30 enables the fan housing 32 to be pivoted away from the wall member 22, thus removing the locator pins 46 from the locator holes 48 and enabling the fan housing 32 to be removed from the wall member 22.

Referring again to FIG. 2, the fan housing 32 may have a number of additional features. In the illustrated embodiment, the fan housing 32 may have a finger guard 56 that enables air to flow through the fan housing 32, while preventing a user's finger from contacting the blades of the fan. The fan housing 32 also comprises a plurality of stops 57 against which the fans abut. In the illustrated embodiment, the stops 57 displace the fans from the finger guard 56 to improve air flow through the fans and improve the acoustic performance of the fans. The fan housing 32 also has a number of notches 58 to enable electrical wiring to be routed between the electrical fan motor and an external power source.

Figure 8:
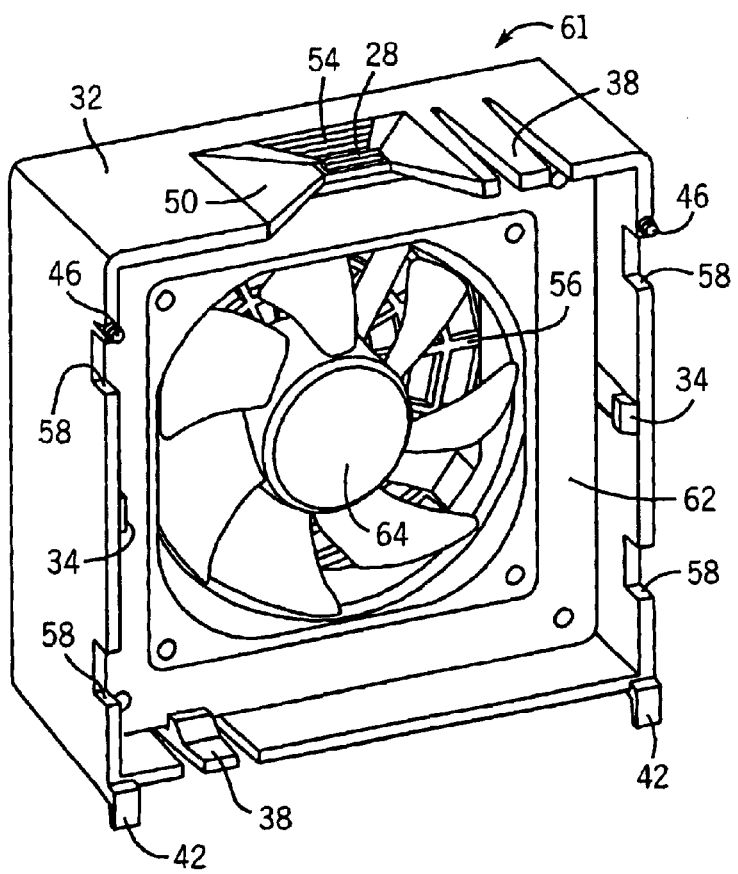
FIG. 8 is a perspective view of a fan assembly having an adapter to enable a fan having a smaller width and height than the first and second fans to be secured within the fan housing, in accordance with an exemplary embodiment of the present invention.

Referring generally to FIG. 8, a third fan assembly 61 is illustrated. The third fan assembly 61 comprises an adapter 62 that is used to enable the fan housing 32 to capture a fan that is smaller in height, width, or depth than the first fan 36 or the second fan 40. In the illustrated embodiment, a third fan 64 is captured within the fan housing 32. As illustrated, the third fan 64 is smaller in height, width, and thickness as compared to the first fan 36 and the second fan 40. However, the adapter 62 may be configured to capture a fan that differs from the first fan 36 and second fan 40 in only one or two dimensions.

In the illustrated embodiment, the adapter 62 is adapted to receive the third fan 64 and center it within the fan housing 32. The adapter 62 has the height and width of the first fan 36 or the second fan 40 so that the adapter 62 and third fan 64 fit securely within the fan housing 32 when disposed therein. In addition, in this embodiment the adapter 62 has the same thickness as the second fan 40, thereby enabling the second catches 38 to capture the adapter 62 and third fan 64 within the fan housing 32. However, the adapter 62 may also have the same thickness as the first fan 36, thereby enabling the first catches 34 to capture the third fan 64 and adapter 62. In addition, rather than receiving the third fan 62 fully within the adapter 62, the adapter 62 may be configured so that the third fan 64 extends from the adapter 62. In this embodiment, the adapter 62 is configured so that the combined thickness of the adapter 62 and the third fan 64 is either the first or second thickness.

The embodiments described above enable fans of various heights, widths, and depths to be secured within an electrical device with a common methodology. A single fan housing is adapted to house and secure fans having various heights, widths, and depths. In other words, the same fan housing can house any one of various fans having different sizes. In addition, the embodiments enable fans to be installed within various electrical devices without fasteners and without any tools.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention be defined by the following appended claims.

What is claimed is:

1. An apparatus for securing a fan to an electronic device, comprising:
   a housing adapted to capture the fan therein, the housing comprising:
   a first catch adapted to capture a fan having a first thickness within the housing; and
   a second catch adapted to capture a fan having a second thickness within the housing, the second thickness being different than the first thickness.

2. The apparatus, as set forth in claim 1, wherein the housing is adapted to be removably and snappingly captured by the fixed member.

3. The apparatus, as set forth in claim 2, wherein the housing comprises a third catch adapted to engage a first portion of the fixed member to secure the housing to the fixed member.

4. The apparatus, as set forth in claim 3, wherein the housing comprises at least one projection adapted to engage at least one opening in the fixed member to secure the housing to the fixed member.

5. The apparatus, as set forth in claim 4, wherein the projection is adapted to enable the housing to pivot relative to the fixed member to enable the third catch to engage the first portion of the fixed member.

6. The apparatus, as set forth in claim 1, wherein the housing comprises a locator adapted to engage a corresponding portion of the fixed member to prevent vertical movement of the housing relative to the fixed member.

7. The apparatus, as set forth in claim 1, wherein at least one of the first catch and the second catch comprises a sloped portion adapted to flex a portion of the fan housing outward as a fan is disposed within the fan housing.

8. The apparatus, as set forth in claim 7, wherein at least one of the first catch and the second catch comprises a flanged portion adapted to abut a fan disposed within the fan housing to prevent the fan from being withdrawn from the fan housing.

9. The apparatus, as set forth in claim 1, wherein the housing is adapted to capture a fan having a first width and a first height within the housing, the apparatus comprising an adapter to enable a fan having at least one of a second width and a second height to be captured by the housing, the second width and the second height being smaller than the first width and the first height, respectively.

10. The apparatus, as set forth in claim 1, wherein the adapter is operable to receive the fan having at least one of a second width and a second height, the adapter having the first width and the first height.

11. An electronic device, comprising:
    a chassis; and
    a fan housing securable to the chassis and operable to capture one of either a first fan having a first thickness within the fan housing or a second fan having a second thickness different than the first thickness within the fan housing.

12. The electrical device, as set forth in claim 11, wherein the fan housing comprises a first flexible member adapted to resiliently flex and capture a fan having the first thickness.

13. The electrical device, as set forth in claim 12, wherein the fan housing comprises a second flexible member adapted to resiliently flex and capture a fan having the second thickness.

14. The electrical device, as set forth in claim 11, wherein the fan housing and chassis are adapted to enable the chassis to capture the fan housing without use of a tool.

15. The electrical device, as set forth in claim 14, wherein the fan housing comprises a third flexible member adapted to be captured by a chassis member without use of a tool.

16. The electrical device, as set forth in claim 15, wherein the third flexible member may be flexed to disengage the third flexible member from the chassis member.

17. The electrical device, as set forth in claim 11, wherein the fan housing consists essentially of a polymeric material.

18. The electrical device, as set forth in claim 11, comprising an electronic component housed within the chassis, wherein the first fan provides a flow of air to cool the electronic component.

19. A method of installing a fan within an electrical device, comprising:
    disposing a fan having a first thickness within a fan housing operable to capture toollessly each of the fan having a first thickness and a fan having a second thickness different than the first thickness when disposed therein; and
    disposing the fan housing within a portion of the electrical device adapted to capture the fan housing when disposed therein.

20. The method as recited in claim 19, wherein disposing a fan having a first thickness within a fan housing comprises engaging a catch adapted to capture the fan having a first thickness within the fan housing.

21. The method as recited in claim 20, wherein disposing the fan housing comprises generating an audible snap to announce securement of the fan housing to the electrical device.

22. The method as recited in claim 19, comprising:

disposing a fan having a second thickness within a second fan housing operable to capture each of the fan having a first thickness and the fan having a second thickness when disposed therein; and disposing the second fan housing within a portion of the electrical device adapted to capture the fan housing when disposed therein.

23. The method as recited in claim 22, wherein disposing a fan having a second thickness within a second fan housing comprises engaging a catch adapted to capture the fan having a second thickness within the fan housing.

24. A system for installing one of a plurality of different fans within one or more electrical devices, comprising:

means for capturing a first fan having a first thickness within a fan mounting member; and means for alternatively capturing a second fan having a second different thickness within the fan mounting member.

25. The system as recited in claim 24, comprising means for capturing the fan mounting member with a portion of an electrical device.

26. The system as recited in claim 24, comprising the first fan.

27. The system as recited in claim 26, comprising a processor, wherein the first fan is operable to provide a flow of air to cool the processor.

28. The system as recited in claim 24, comprising the second fan.

29. An apparatus for securing a fan to an electronic device, comprising:

a first catch operable to capture a fan within the apparatus;

a securing member operable to engage a first portion of the electronic device; and a pivoting member operable to engage a second portion of the electronic device to enable the apparatus to pivot relative to the electronic device to engage the securing member with the first portion of the electronic device.

30. The system as recited in claim 29, comprising a projection adapted to engage a corresponding recess in the electronic device as the apparatus is pivoted to engage the securing member with the first portion of the electronic device.

* * * * *